United States Patent
Assad

[19]

[11] Patent Number: 6,043,425
[45] Date of Patent: Mar. 28, 2000

[54] SOLAR POWER SOURCE WITH TEXTURED SOLAR CONCENTRATOR

[75] Inventor: Chahriar Assad, Los Angeles, Calif.

[73] Assignee: Hughes Electronics Corporation, El Segundo, Calif.

[21] Appl. No.: 09/165,757

[22] Filed: Oct. 2, 1998

[51] Int. Cl.[7] .................................................. H01L 25/00
[52] U.S. Cl. ............................................ 136/246; 136/292
[58] Field of Search ...................................... 136/246, 292

[56] References Cited

U.S. PATENT DOCUMENTS

| | | | |
|---|---|---|---|
| 4,131,485 | 12/1978 | Meinel et al. | 136/246 |
| 4,143,233 | 3/1979 | Kapany et al. | 136/246 |

OTHER PUBLICATIONS

Nov. 21, 1998 New Scientist Magazine "Bright lights that don't dazzle", Mick Hamer.

*Primary Examiner*—Mark Chapman
*Attorney, Agent, or Firm*—Georgann S. Grunebach; M. W. Sales

[57] ABSTRACT

A solar power source has a solar power converter, and a solar concentrator positioned to reflect incident light toward the solar power converter. The solar concentrator includes a support having a texture pattern formed thereon, and a reflector surface on the support. The support includes a layer of plastic, and the reflector surface is a layer of a metal, such as aluminum, deposited on the layer of plastic. The texture is formed in the layer of plastic, and is visible on a free surface of the reflector. The texture pattern may be a set of parallel linear recesses.

18 Claims, 4 Drawing Sheets

SOLAR POWER SOURCE WITH TEXTURED SOLAR CONCENTRATOR

BACKGROUND OF THE INVENTION

This invention relates to solar power systems, and, more particularly, to a solar power source having a solar concentrator, and to an approach for improving the performance of the solar concentrator and thence the solar power system.

A solar power system has a solar power converter that converts incident light energy into power. One type of solar power system includes a solar panel, which is a photovoltaic device that converts the incident light energy into electrical power. Such solar power systems are used on many types of spacecraft to provide a replenishable source of power. For example, most geosynchronous communications satellites use solar power systems to produce the power needed to amplify received signals for re-transmission back to earth.

Solar panels typically include a solar cell, which is a semiconductor material that achieves the conversion of light energy into electrical current. The output power of the solar cell increases with the intensity of the incident light, and it is therefore desirable to increase the incident intensity above that associated with normal incident sunlight. Such an increase may be accomplished with a lens, but a lens is too heavy to be practical for spacecraft applications.

Another approach to increasing the intensity of the incident light is to use a solar concentrator, which is a reflective panel positioned adjacent to the solar panel to reflect incident light toward the solar panel. The intensity of the light incident upon the solar panel is therefore up to several times that of the normal intensity of sunlight. The concentrator is much lighter in weight than the solar panel, so that a greater incident energy of sunlight is effectively utilized for generating electrical power without a comparable increase in weight.

Existing solar concentrators improve the performance of solar power systems substantially. However, the present inventor has recognized that limitations in fabrication technology prevent the existing solar concentrators from achieving their potential performance. A conventional solar concentrator for spacecraft applications comprises a thin layer or sheet of plastic material with an overlying layer of a reflective metal such as aluminum. Defects in the reflective layer, such as wrinkles, holes, or deposition defects, can produce shadows on the solar panel, concentrate the incident sunlight as hot spots in some regions, scatter the incident sunlight, or otherwise interfere with the light field incident upon the solar panel. The result is an uneven distribution of light intensity across the face of the solar panel, which adversely affects its performance. It is difficult to avoid such problems even with careful attention to the fabrication of the solar concentrator, inasmuch as its area is quite large.

There is, accordingly, a need for an improved solar concentrator for use in solar power systems. The present invention fulfills this need, and further provides related advantages.

SUMMARY OF THE INVENTION

The present invention provides a solar power source with a solar concentrator that is improved to reduce and, ideally, avoid uneven light distributions across the face of the solar power converter. The result is more predictable, more uniform, and more-nearly-optimal performance of the solar power converter. The approach of the invention does not add to the weight of the solar power source, and can be tailored for a wide variety of useful effects. This approach does not change the system arrangement of the solar power source, permitting the present invention to be used with existing types of solar power sources as well as new types developed in the future.

In accordance with the invention, a solar power source comprises a solar power converter, and a solar concentrator positioned to reflect incident light toward the solar power converter. The solar concentrator comprises a support having a texture pattern formed thereon, and a reflector surface on the support, the texture pattern being visible in a free surface of the reflector.

The solar power converter is preferably a solar cell, although the present invention may be used with other solar power convertors such as boilers. The support preferably comprises a layer of plastic, and the texture pattern is formed in the plastic. The texture pattern is desirably a set of parallel lines, oriented perpendicular to the line of intersection wherein the solar concentrator intersects the solar power converter. This preferred texture pattern reflects the light preferentially in the direction toward the solar cell, rather than in other directions, so that no light energy is lost. Other texture patterns may also be applied and used for particular applications. The reflector surface is preferably a thin layer of a reflective metal such as aluminum, deposited on the support.

The pattern of lines on the reflective free surface slightly scatters the reflected light that is incident upon the reflective free surface. This scattering softens or eliminates the optical effects of any defects that might be present in the support and/or the reflective surface. No light energy is lost, but instead the spatial distribution is altered. The result is a more nearly uniform light distribution reaching the surface of the solar power converter. A uniform light distribution is particularly important where the solar power converter is a solar cell, as nonuniformities in the light reaching the different areas on the surface of the solar cell may have substantial adverse effects on the efficiency and output of the solar cell.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
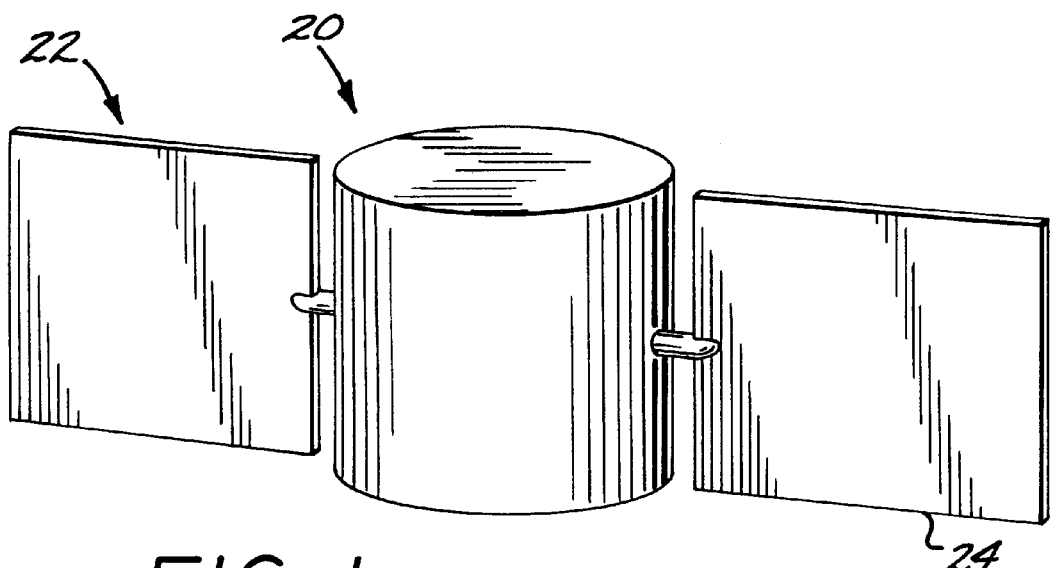
FIG. 1 is a perspective view of a satellite with a solar power source.
Figure 2:
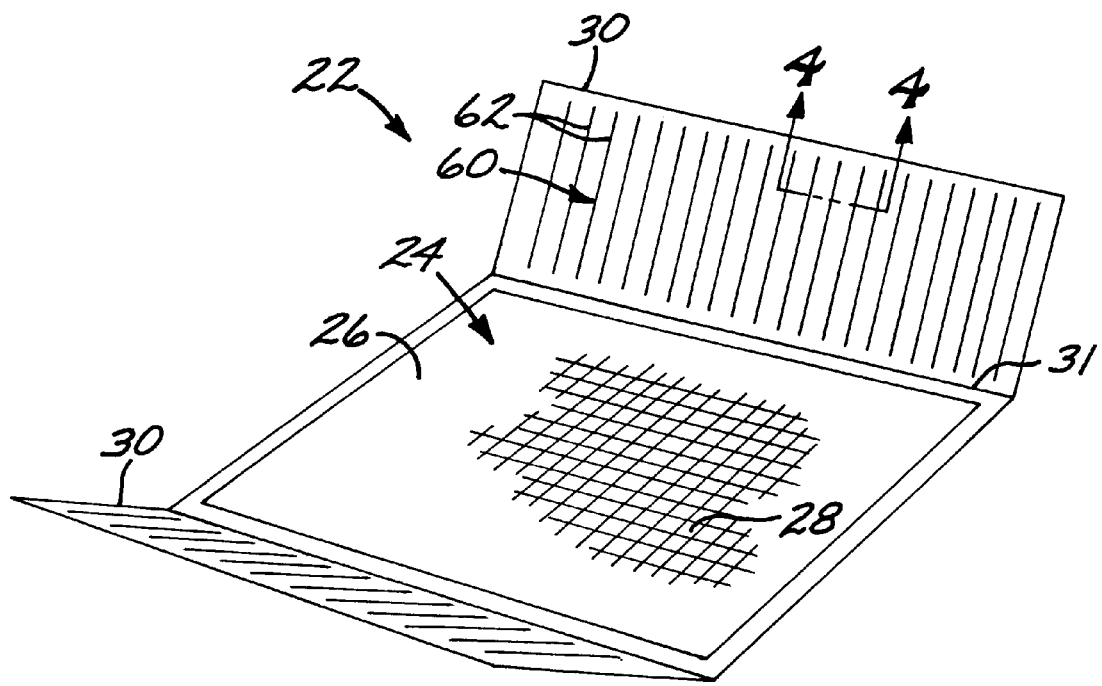
FIG. 2 is a perspective view of a portion of the solar power converter of the solar power source of FIG. 1.

FIG. 1 depicts a spacecraft in the form of a communications satellite 20 that utilizes a solar power source 22 to provide electrical power for amplifying signals and for other spacecraft operations. As shown in FIG. 2, the solar power source 22 includes a solar power converter 24 extending outwardly from the central body of the satellite 20 and having a solar cell array 26 in the form of a panel with at least one, and typically a plurality of, solar cells 28. The solar cell array 26 converts incident sunlight into electrical power. Such solar cell arrays 26 and the associated electrical power system are known in the art.

Improved performance on a power-to-weight basis may be obtained by concentrating the incident sunlight onto the surface of the solar cell array 26. To achieve the concentration of sunlight, a solar concentrator 30 is provided, in the form of a panel on either side of the solar cell array 26. The solar concentrator 30 functions as a mirror to reflect sunlight onto the solar cell array 26, which sunlight otherwise would not impinge onto the solar cell array 26 due to its physical size. The solar concentrator 30 may be made very light in weight, and in particular lighter than the solar cell array 26 itself, so that the net result is improved power-to-weight performance of the solar power converter 24. In the preferred form, the panel of the solar concentrator 30 intersects the panel of the solar power converter 24 along a line of intersection 31, which is preferably a straight line. The line of intersection may be an actual physical intersection as shown in FIG. 2. The line of intersection may equivalently be a virtual line of intersection of the extrapolations of the surfaces of the panels in space, in those cases where the solar concentrator 30 is physically separated from the solar power converter 24 but is still oriented to reflect light toward the solar power converter.

Figure 3:
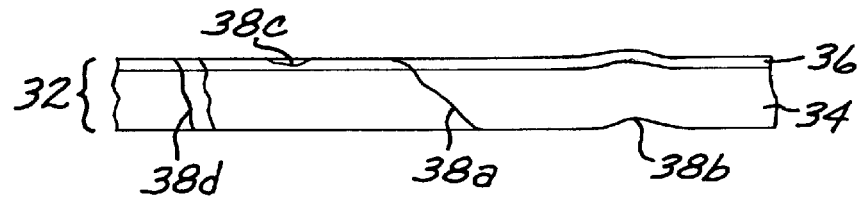
FIG. 3 is a schematic sectional view of a conventional solar concentrator.

FIG. 3 depicts a conventional solar concentrator 32. The solar concentrator 32 includes a support 34 with a reflector 36 deposited on the support 34. In a typical case, the support 34 is a thin sheet of a polymer such as 0.001 inch thick polyimide, which is available from DuPont as Kapton™ polymer sheet. The reflector 36 is formed of a thin layer of a metal such as aluminum deposited on the support 34. The support 34 is typically about 0.001 inch thick, and the reflector 36 is about 1000–1500 Angstroms thick.

Figure 6A:
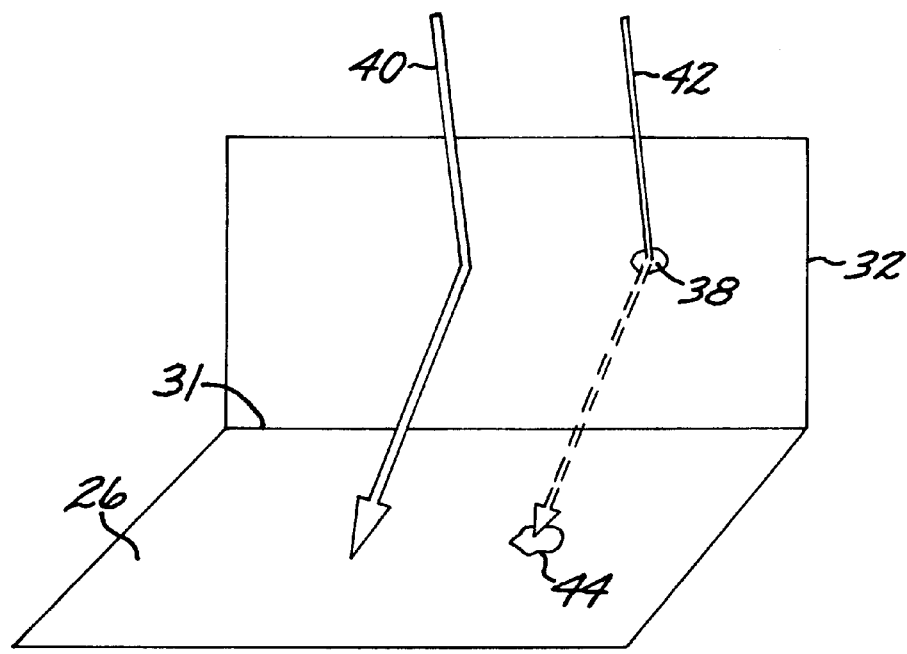
FIG. 6A is a schematic light ray path for a conventional solar concentrator.

In principle, this conventional solar concentrator 32 works well and is light in weight, and achieves a perfect reflection of incident sunlight onto the solar cell array 26. The inventor has recognized that, in practice, there are obstacles to achieving the optimum performance of the conventional solar concentrator 32. The solar concentrator 32 is quite large in extent. For a current communications satellite 20, each of the solar concentrators 32 is about 80 inches by 140 inches in size. In a thin structure of this type, there are inevitably small defects 38 in the solar concentrator 32, such as tears 38a in the support 34, wrinkles 38b, deposition defects 38c in the metallic reflector 36, and holes 38d entirely through the solar concentrator 32. The result of the presence of the defects 38 is illustrated in FIG. 6A. A light ray 40 incident upon a defect-free area of the conventional solar concentrator 32 is reflected to the solar cell array 26. However, a light ray 42 incident upon the conventional solar concentrator 32 in the area of a defect 38 is not reflected to the location to which it would otherwise be reflected, leaving a shadow 44 on the solar cell array 26. (Other defects can overly concentrate the incident sunlight in some areas, leading to hot spots on the solar cells as well as shadows.) The output power from the solar cells lying in the shadow 44 is reduced, so that this shadow reduces the efficiency of the solar cell array 26. Even though great care may be taken to achieve a high perfection in the conventional solar concentrator 32, all of the defects 38 in the as-fabricated structure cannot be avoided or eliminated with the available fabrication technology. Additionally, new defects may be produced during service, such as holes resulting from the passage of micrometeorites through the conventional solar concentrator.

Figure 4A:
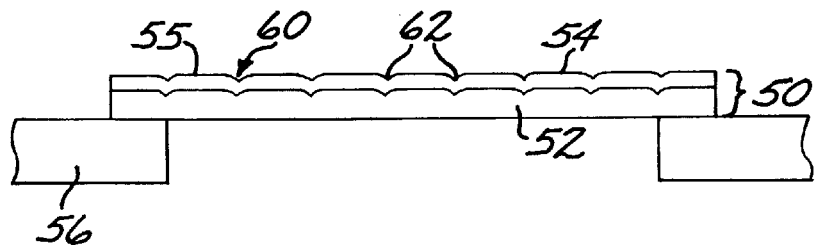
FIG. 4A is a schematic sectional view of a first embodiment of the solar concentrator, taken on line 4—4 of FIG. 2.
Figure 4B:
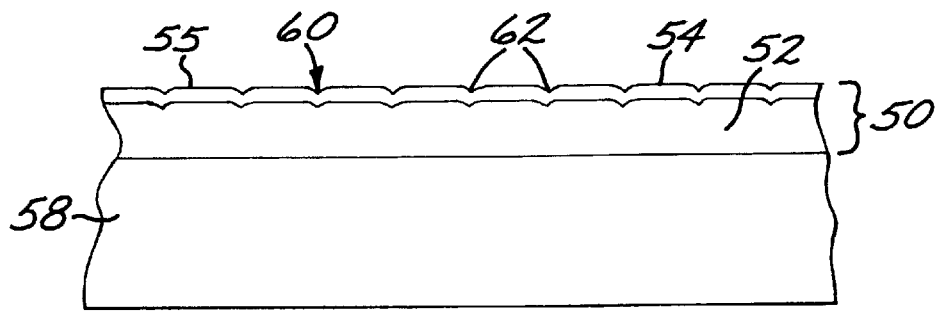
FIG. 4B is a schematic sectional view of a second embodiment of the solar concentrator, taken on line 4—4 of FIG. 2.

FIGS. 4A–4B depict a solar concentrator 50 according to the present invention. As with the conventional solar concentrator 32, the solar concentrator 50 includes a support 52 and a reflector 54 lying on one side of the support 52. The support 52 comprises a thin layer or sheet of a polymer such as 0.001 inch thick polyimide film, which is available from DuPont as Kapton™ polymer sheet. Other types of polymers such as polyethylene terepthalate polyester (Mylar™ polymer sheet) and FEP polytetrafluoroethylene (teflon sheet) may also be used in particular applications. The reflector 54 is formed of a thin layer of a metal such as aluminum deposited on the support 52, and has a free surface 55. (The free surface 55 is the surface of the reflector 54 upon which the sunlight is incident, and is remote from the support 52.) Other materials may be used for the reflector 54, such as silver or gold. The support 52 is preferably from about 0.0002 inch to about 0.010 inch, most preferably about 0.001 inch, thick. The reflector 54 is typically much thinner than the support 52, and is preferably from about 500 Angstroms to about 3000 Angstroms, most preferably from about 1000 to about 1500 Angstroms, thick, although the invention is operable for thicknesses of the support 52 and the reflector 54 outside of these preferred ranges. If the support 52 and reflector 54 are thinner, they may suffer a loss of integrity. If they are thicker, weight is added without additional benefit. The solar concentrator 50 may be mounted in a frame 56, or may be provided with an additional substrate 58, also sometimes termed a support base, which in either event supports the solar concentrator 50 and allows it to be handled, mounted, and positioned during installation and service. Coatings such as protective coatings may optionally be placed over the free surface 55, if desired.

The solar concentrator 50 differs from the conventional solar concentrator 32 in the presence of a texture pattern 60 in the solar concentrator 50 of the invention. The texture pattern 60 is preferably formed in the support 52, and then the reflector 54 is deposited overlying the support 52, so that the texture pattern 60 is reproduced in the reflector 54 and is visible in the free surface 55 of the reflector 54. A preferred texture pattern 60 is a set of parallel, straight linear recesses 62, as shown in FIGS. 2, 4A, 4B, and 6B. The lines of the set of linear recesses 62 are oriented substantially perpendicular to the line of intersection 31 of the solar concentrator 50 and the solar power converter 24. The linear recesses 62 may be spaced apart by any desired distance. Preferably, the density of recesses is less than about 300 recesses per millimeter, as greater numbers of recesses per millimeter tend to diffract visible light. More preferably, the density of recesses is about 30 recesses per millimeter. The depth of the recesses is less than the thickness of the support 52, and is preferably from about 0.00004 inch to about 0.004 inch. Greater or lesser depths of the recesses may also be used for some applications. The profile of the recesses 62 may be of any operable type, such as, for example, a sine wave, a square wave, or a triangle wave. The recesses 62 may be regularly or irregularly spaced from each other, and may be of the same or different spacings, depths, and shapes.

The parallel linear recesses 62, oriented perpendicular to the line of intersection 31, reflect the incident light toward the solar cell array 26 to contribute to the production of electrical energy. Light energy is not reflected in other directions, and is therefore not lost.

Figure 5:
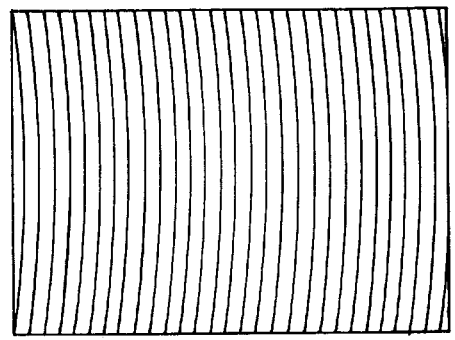
FIG. 5 is a plan view of a portion of an alternative texture pattern.

Other types of texture patterns 60, such as a pattern of curved lines otherwise parallel to each other and shown in FIG. 5, may be used. Examples of other types of texture patterns include holographic figures or Fresnel figures.

Figure 6B:
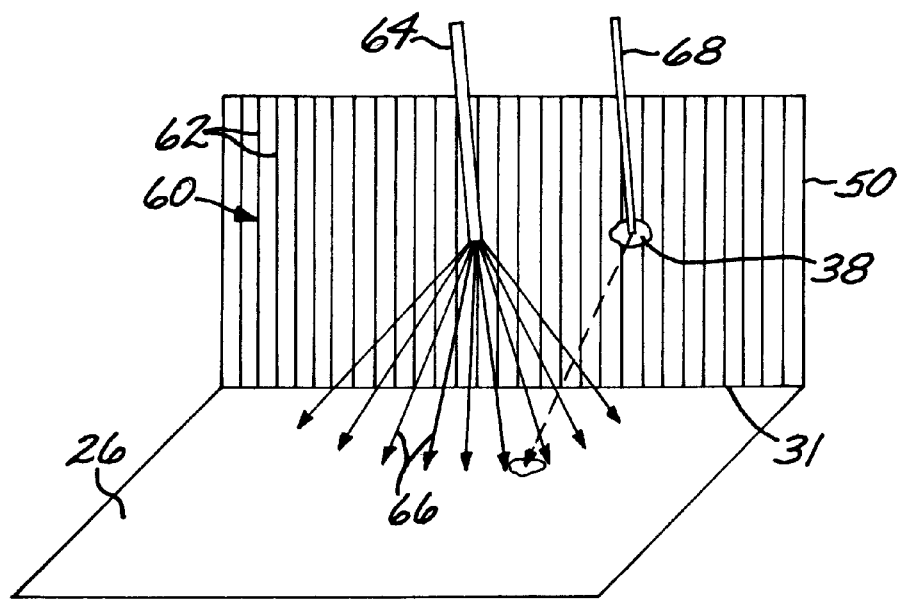
FIG. 6B is a schematic light ray path for the textured solar concentrator.

FIG. 6B illustrates the beneficial effect of the presence of the texture pattern 60 in the preferred form of the set of linear recesses 62 oriented perpendicular to the line of intersection 31. A beam 64 incident upon a defect-free region of the solar concentrator 50 is scattered by the set of linear recesses 62 to scattered beams 66. These scattered beams 66 are incident upon the solar cell array 26 in a somewhat specular manner, so that the energy of the incident beam 64 is spread over a wider area of the solar cell array 26 than is the case in FIG. 6A. The solar concentrator 50 may still be expected to include defects 38 of the same type discussed earlier in relation to FIG. 3. A beam 68 incident upon a defective region 38 is not reflected, but there is no region corresponding to the shadow 44 of FIG. 6A, because of the scattering of the other incident beams 64 into the scattered beams 66.

Consequently, the intensity of the light energy incident upon the solar cell array 26 is more uniform than in the case of the conventional solar concentrator 32. The result is better overall performance of the solar power converter 24, because an irregular distribution of the incident intensity on the solar cells leads to electrical inefficiencies in the electrical output of the array of solar cells. The present approach evens out the light energy distribution incident upon the solar cell array, producing better electrical output from the array.

Figure 7:
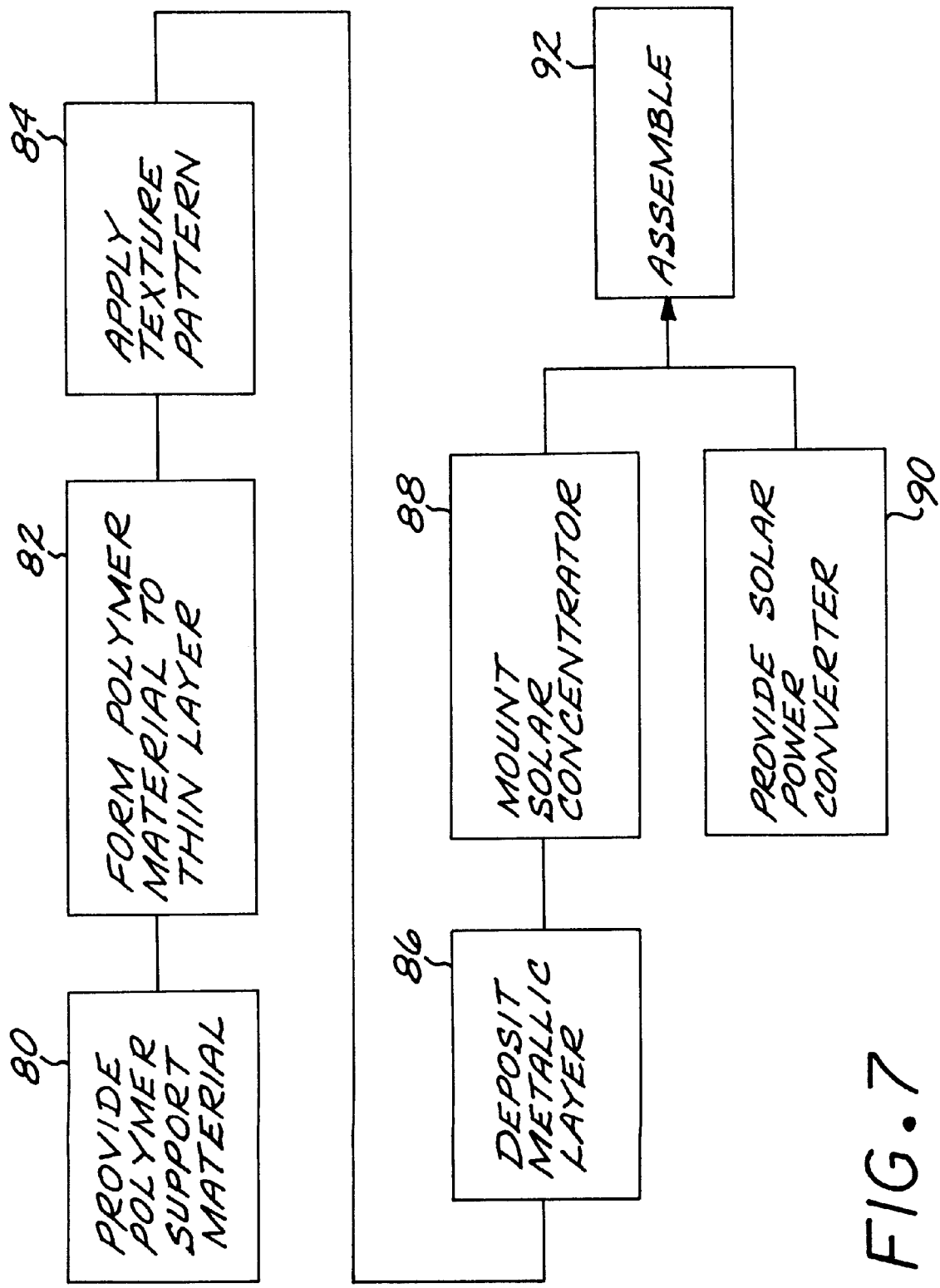
FIG. 7 is a block flow diagram of a method for fabricating the solar concentrator.

FIG. 7 is a block flow diagram of a preferred method for fabricating a solar power source according to the invention. The polymer support material is provided, numeral 80. This material is provided as a mass, which is then formed to a thin layer as required for the support 52, numeral 82. The texture pattern is applied to and formed in the support layer 52, numeral 84. The texture pattern is an array of features formed intentionally into the support layer 52, as distinct from features such as defects that are unintentionally present. The texture pattern is preferably a set of linear features, with the lines locally oriented parallel to each other.

The steps 80, 82, and 84 may be performed by the support material film manufacturer, such as DuPont in the case of Kapton™ material. For example, the forming step 82 may be performed by passing the polymer material through dies or between rollers, with the dies or rollers having the negative of the texture pattern 60, so that the texture pattern is formed into the sheet of the polymer material. In an alternative approach, flat, untextured sheets of polymer material may be purchased from the manufacturer, and the end user may emboss the texture pattern in step 84, as by passing the untextured sheets of polymer material over a slightly heated roller. In either case, the texture pattern may be formed by other operable techniques, such as brushing a piece of sandpaper over the surface of the sheet of the polymer material in a single direction to form the recesses, with the depth and spacing of the recesses being determined by the grit of the sandpaper and the pressure applied to the sandpaper.

After the texturing of the polymer support material is complete, the metallic reflector 54 is deposited on the support 52 to the desired thickness, numeral 86. In the case of the preferred aluminum metallic reflector 54, the aluminum is deposited by physical vapor deposition. Because the thickness of the metallic reflector 54 is smaller than that of the support 52, the texture pattern of the support 52 is reproduced into the free surface 55 of the metallic reflector 54. The solar concentrator 50 having the reflector 54 deposited on the support 52 is mounted to the frame 56 as in FIG. 4A, to the substrate 58 as in FIG. 4B, or to some other structure, numeral 88, to complete the fabrication of the solar concentrator 50.

The solar power converter 24 is provided in a completed form, numeral 90. The solar power converter 24 preferably includes the solar cell array 26, but other types of solar power converters such as boiler tubes may be used where appropriate. The manufacture of solar power converters of various types is known in the art.

The solar power converter and the solar concentrator are assembled into a device, such as the solar power source 22, numeral 92.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A solar power source, comprising:
   a spacecraft;
   a solar power converter affixed to the spacecraft; and
   a solar concentrator positioned to reflect incident light toward the solar power converter, the solar concentrator comprising
      a support having a texture pattern formed thereon as a set of recesses in a surface of the support, and
      a reflector layer on the support, the texture pattern being visible in a free surface of the reflector layer.

2. The solar power source of claim 1, wherein the solar power converter comprises at least one solar cell.

3. The solar power source of claim 1, wherein the texture pattern comprises a set of parallel linear recesses.

4. The solar power source of claim 3, wherein the solar concentrator intersects the solar power converter along a line of intersection, and wherein the set of parallel linear recesses is oriented substantially perpendicular to the line of intersection.

5. The solar power source of claim 1, wherein the support comprises a layer of plastic, and the texture pattern is formed in the plastic.

6. The solar power source of claim 1, wherein the support comprises
   a substrate, and
   a layer of plastic overlying the substrate, and the texture pattern is formed in the plastic.

7. The solar power source of claim 1, wherein the solar concentrator further comprises a frame in which the support is mounted.

8. The solar power source of claim 1, wherein the reflector layer is a layer of metal.

9. The solar power source of claim 1, wherein the reflector layer is a layer of aluminum.

10. The solar power source of claim 1, wherein the support is flat, except for the texture pattern thereon.

11. A solar power source, comprising:
    a solar power converter; and a solar concentrator positioned to reflect incident light toward the solar power converter, the solar concentrator comprising
  a layer of plastic having a texture pattern formed therein, wherein the texture pattern comprises a set of recesses, and
  a layer of metal deposited on the layer of plastic, the texture pattern being visible in a free surface of the layer of metal.

12. The solar power source of claim 10, wherein the texture pattern comprises a set of parallel linear recesses.

13. The solar power source of claim 12, wherein the solar concentrator intersects the solar power converter along a line of intersection, and wherein the set of parallel linear recesses is oriented substantially perpendicular to the line of intersection.

14. The solar power source of claim 10, wherein the layer of metal is a layer of aluminum.

15. The solar power source of claim 11, wherein the support is flat, except for the texture pattern thereon.

16. A solar power source, comprising:
  a solar power converter comprising at least one solar cell; and
  a solar concentrator positioned to reflect incident light toward the solar power converter, the solar concentrator intersecting the solar power converter along a line of intersection, the solar concentrator comprising
    a layer of plastic having a texture pattern formed therein, the texture pattern comprising a set of parallel linear recesses oriented substantially perpendicular to the line of intersection, and
    a layer of metal deposited on the layer of plastic, the texture pattern being visible in a free surface of the layer of metal.

17. The solar power source of claim 16, wherein the line of intersection is a physical line of intersection.

18. The solar power source of claim 16, wherein the support is flat, except for the texture pattern thereon.

* * * * *